US009923655B2

(12) United States Patent
Jaisimha et al.

(10) Patent No.: US 9,923,655 B2
(45) Date of Patent: *Mar. 20, 2018

(54) METHOD AND APPARATUS FOR MODE BALANCE FOR ANALOG FM, DIGITAL, RADIO BLEND LOGIC IN AN AUTOMOTIVE ENVIRONMENT

(71) Applicant: Panasonic Automotive Systems Company of America, division of Panasonic Corporation of North America, Peachtree City, GA (US)

(72) Inventors: Shree Jaisimha, Senoia, GA (US); Donald Thomas, Smyrna, GA (US); Kazuo Morita, Peachtree City, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/383,284

(22) Filed: Dec. 19, 2016

(65) Prior Publication Data

US 2017/0195075 A1 Jul. 6, 2017

Related U.S. Application Data

(63) Continuation of application No. 14/529,954, filed on Oct. 31, 2014, now Pat. No. 9,559,657.

(Continued)

(51) Int. Cl.
*H04B 1/40* (2015.01)
*H04H 60/32* (2008.01)
*H03G 3/20* (2006.01)
*H04H 60/65* (2008.01)
*H04H 60/58* (2008.01)
*H04B 1/16* (2006.01)

(52) U.S. Cl.
CPC .............. *H04H 60/32* (2013.01); *H03G 3/20* (2013.01); *H04B 1/16* (2013.01); *H04H 60/58* (2013.01); *H04H 60/65* (2013.01)

(58) Field of Classification Search
CPC ........ H04B 1/40; H04B 1/3822; H04B 1/406; H04B 1/44; H04B 1/54; H04B 1/16; H03J 3/14; H04H 60/74; H03G 3/26; H03G 3/32
USPC ........ 455/77, 120, 125, 150.1, 154.1, 161.1, 455/161.2, 186.1, 186.2
See application file for complete search history.

(56) References Cited

U.S. PATENT DOCUMENTS 5,138,457 A * 8/1992 Sakai ..................... H04N 5/605
348/725
6,865,379 B1 * 3/2005 Liebenow .............. H03G 3/341
455/161.1

(Continued)

Primary Examiner — Nhan Le
(74) Attorney, Agent, or Firm — Laurence S. Roach, Esq.

(57) ABSTRACT

A radio includes a first tuner and a second tuner. A processor compares a first perceivable volume level of a station tuned by the first tuner to at least one second perceivable volume level of at least one background station tuned by the second tuner. The processor enables automatic volume knob changes using a pre-calibrated lookup table that associates a volume step of the volume knob with a difference between the first perceivable volume level and the second perceivable volume level.

20 Claims, 11 Drawing Sheets

Related U.S. Application Data

(60) Provisional application No. 61/898,206, filed on Oct. 31, 2013.

(56) References Cited

U.S. PATENT DOCUMENTS

| | | | |
|---|---|---|---|
| 9,559,657 B2* | 1/2017 | Jaisimha | H03G 3/3026 |
| 2008/0268802 A1* | 10/2008 | Ricard | G10L 25/78 455/179.1 |

* cited by examiner

| Current State | Event | Next State | End User Issue |
|---|---|---|---|
| Use case 1: User is listening to a low modulation FM for example a speech broadcast | User now skips to a new station with higher modulation, for example: Heavy metal | User now listens to a station with higher modulation | User perceives an increase in volume levels although he/she is currently tuned to same FM band for a specified volume level. |
| Use case 2: User is listening to a high modulation station in FM, for example: Heavy metal | User now skips to a new station with low modulation, example a speech broadcast or classical musical piece | User now listens to a station with lower modulation | User perceives a decrease in volume level although he/she is currently tuned to same FM band for a specified volume level. |
| Use case 3: User is listening to multimedia source with a particular modulation level for a song | Traffic announcement either occurs in FM or DAB band | Radio HU switches from multimedia to Traffic announcement source | User perceives a difference in volume level depending on modulation in FM or the bitrate employed for the DAB station |
| Use case 4: User is listening to a DAB station with low bitrate | User now skips to a new DAB station with higher bitrate | User hears an audio difference in levels if the compressed bitrate is different | User perceives volume level |

FIG. 2A
(Prior Art)

| Use case 5: Within current tuned station: Suppose user is listening to either analog AM/FM station | Assuming the AM or FM station is a HD IBOC station and gets HD IBOC acquisition and now transitions to HD audio with higher bandwidth | User now goes to either Am or FM HD mode for same tuned station | User perceives a temporal increase in volume level over time depending on the bandwidth difference in audio even though the volume setting level is the same |
|---|---|---|---|
| Use case 6: Within current tuned station: User is listening to Analog FM radio station in North America which has simulcast broadcast on the internet | User goes out of transmitter coverage area. User has embedded cell modem. Current listened station has a IP broadcast fall back | Car radio switches to IP Radio to ensure end user can have continued broadcast. | User can either perceive an increase or decrease in volume level depending on the bitrate compression of the IP Radio station transmission. |
| Use case 7: Within current tuned station such as DAB: User is listening to DAB digital radio station in Europe with a particular service id | User goes out of transmitter coverage area the radio unit will first try to do a DAB to DAB switch to the same service id before trying to engage for a simulcast audio source on the FM band if the DAB to DAB switch fails | Car radio switches to another DAB service channel within another ensemble | User can either perceive an increase or decrease in volume level depending on the bitrate compression of this new DAB service station. |

FIG. 2B
(Prior Art)

| Current State | Event | Next State | End User Issue |
|---|---|---|---|
| Use case 8: Within a current tuned source User tunes to a HD MPS (Main program station that is on center frequency) station to another HD MPS station | New HD MPS station has different bandwidth encoding due to compression rate used | Car radio switches to new HD IBOC service channel another center frequency | User can either Perceive an increase or decrease in volume level depending on the bitrate compression of this new HD IBOC service station. |
| Use case 9: User is listening to a station that changes content. For example, BBC will have news (speech) audio at the top of the hour. After the news, the audio content changes to heavy metal. | User during the news can increase the volume to hear the speech audio better. However when doing the switch to heavy metal will end up manually switching the audio knob lower. | User hears the heavy metal audio | User during news can increase the volume to hear the speech audio better. However when doing the switch to heavy metal will end up manually switching the audio knob lower. |

FIG. 2C
(Prior Art)

| Service | Audio Mode | Frequency Response | Stereo Separation | Dynamic Range | Perceived Audio Quality |
|---|---|---|---|---|---|
| AM Analog | Mono | 0.05 to 5 kHz | None | 60 dB | AM |
| AM HD Main Channel | Stereo | 0.02 to 15 kHz | 70 dB | 72 dB | FM like |
| AM HD Back up Channel | Mono | 0.02 to 10 kHz | None | 60 dB | AM mono |
| FM Analog | Stereo | 0.03 to 15 kHz | 65 dB | 80 dB | FM like |
| FM HD Main Channel | Stereo | 0.02 to 20 kHz | 70 dB | 96 dB | CD like |
| FM HD Backup Channel | Stereo | 0.02 to 15 kHz | None | 65 dB | FM like |

FIG. 3
(Prior Art)

| Current State | Event | Next State | End User Issue |
|---|---|---|---|
| Use case 1: User is listening to a low modulation FM for example classical music | User now skips to a new station with higher modulation, example heavy metal | User now listens to a station with higher modulation | User Perceives an increase in volume levels although he/she is currently tuned to same FM band for a specified volume level. |
| Use case 2: User is listening to a high modulation station in FM (example heavy metal) | User now skips to a new station with low modulation (example classical music) | User now listens to a station with lower modulation | User perceives a decrease in volume level although he/she is currently tuned to same FM band for a specified volume level. |
| Use case 3: User is listening to multimedia source with a particular modulation level for a song | Traffic announcement either occurs in FM or DAB band | Radio HU switches from multimedia to Traffic announcement source | User Perceives a difference in volume level depending on modulation in FM or the bitrate employed for the DAB station. |
| Use case 4: User is listening to a DAB station with low bitrate | User now skips to a new DAB station with higher bitrate | User hears an audio difference in levels if the compressed bitrate is different | User perceives volume level. |

FIG. 5A

| Current State | Event | Next State | End User Issue |
|---|---|---|---|
| Use case 5: Within current tuned station: Suppose user is listening to either analog AM/FM station | Assuming the AM or FM station is a HD IBOC station and gets HD IBOC acquisition and now transitions to HD Audio with higher bandwidth | User now goes to either AM or FM HD mode for same tuned station | User perceives an temporal increase in volume level over time depending on the bandwidth difference in audio even though the volume setting level is the same. |
| Use case 6: Within current tuned station: User is listening Analog FM radio station in North America which has simulcast broadcast on the internet | User goes out of transmitter coverage area. User has embedded cell modem. Current listened station has a IP broadcast fall back. | Car radio switches to IP Radio to ensure end user can have continued broadcasting | User can either perceive an increase or decrease in volume level depending on the bitrate compression of the IP Radio station transmission. |
| Use case 7: Within current tuned station such as DAB: User is listening to digital DAB digital radio station in Europe with a particular service id | User goes out of transmitter coverage area the radio unit will first do a DAB to DAB switch to the same service id before trying to engage for a simulcast audio source on the FM band | Car radio switches to another DAB service channel within another ensemble | User can either perceive an increase or decrease in volume level depending on the bitrate compression of this new DAB service station. |
| Use case 8: Within a current tuned source: User tunes to a digital HD station to another HD station. | New HD station has different bandwidth encoding due to compression rate used | Car radio switches to new HD IBOC service channel another center frquency | User can either perceive an increase or decrease in volume level depending on the bitrate compression of this new HD IBOC service station. |

FIG. 5B

| Frequency | Signal Quality | Volume Level | Digital or Analog tag | Trust Timer |
|---|---|---|---|---|
| | | | | |
| | | | | |

FIG. 7

| Frequency | Signal Quality | Modulation level average | Trust Timer |
|---|---|---|---|
| | | | |
| | | | |

FIG. 8

METHOD AND APPARATUS FOR MODE BALANCE FOR ANALOG FM, DIGITAL, RADIO BLEND LOGIC IN AN AUTOMOTIVE ENVIRONMENT

CROSS-REFERENCE TO RELATED APPLICATION

This application is a continuation of U.S. patent application Ser. No. 14/529,954, filed on Oct. 31, 2014, now U.S. Pat. No. 9,559,657, issued on Jan. 31, 2017, and claims benefit to U.S. Provisional Patent Application Ser. No. 61/898,206, filed on Oct. 31, 2013, which are incorporated herein by reference in their entirety.

BACKGROUND OF THE INVENTION

Description of the Prior Art

Mode balancing is a technique used in radio head units to provide constant perceived volume levels when the user traverses across the different mode sources such as CD, Multimedia, AUX, FM and/or AM. Audio attenuation levels are placed in a way to make the volume perceptually the same and prevent customer listening discomfort. Without mode balance, the user would experience a sudden discomfort due to perceived volume increase for the same volume step he has set on the radio. While the concept of mode balance applies to different sources, achieving mode balance within a source is difficult to achieve. This in turn applies to multimedia content that can be stored with different compression rates.

The interplay between Analog, Digital and IP Radio is now coming to fruition due to connectivity availability in the car radio head unit, either through tethering of a cell phone or a dedicated embedded cell modem. FIG. 1 illustrates the current interplays and use cases that now exist due to known enabling technologies. The interplay on the IP front can take on facets that encompass mobile TV use cases depending on how the broadcaster scope and scale takes shape. The current state of art used in car radio head units is the following:

When a user changes from one source to another, the current state of art employs timed fade-in and fade-out mechanisms. As an example, switching from an AM source to an FM source uses a 500 ms fade-in (the current audio source is slowly muted with audio ramp) and fade-out (the new audio source is slowly unmuted with audio ramp). This approach does not scale for within a source.

Digital radio and improved connectivity bring about new permutations for the end user for continued audio listenership of the same audio via different broadcast media (e.g., IP Radio, Analog AM/FM, AM HD IBOC, FM HD IBOC and SiriusXM). Connectivity and new bridging enablers like RadioDNS (www.radiodns.org) allow the user to link to IP radio. A user can be listening to an AM/FM station and if the signal fades he can continue to listen to the current song through either the Digital Radio transition or IP Radio through enabling technologies such as FM to DAB link or Radio DNS. FM to DAB link applies in Europe where the Program identification (PI) code of a radio station is linked to the DAB station's Service ID that serves as basis of confirmation of the same audio content to allow for a switch. Radio DNS applies to embedded cell modems and involves an off board server keeping a table that maps the PI code of a radio station to the URL address of the station's Internet Protocol station. An example for Radio DNS is in the USA where the radio station span is within the range of the transmitter. The concept of continued reception is now a possibility with improved connectivity. The IP switch typically will be based on a cost based optimization for the end user, meaning a switch from "free" analog or HD IBOC AM/FM stations (where accessible) to IP radio based on a model of the connectivity subscription model used. A problem is that changing between different broadcast media for the same simulcast listened-to broadcast audio can bring about a difference in perceived volume levels. The RadioDNS mapping can allow the radio head unit to trigger the switch to IP Radio if the current tuned signal medium fades away or vice versa, provided the radio head unit includes a browser.

Consider the following use cases and current issue illustrated in the use case table of FIGS. 2A-B. At a high level Use Cases 5 and 9 can be grouped as examples of intra-station effects with the user experiencing a difference in perceived audio volume by simply staying tuned to the current station in the presence of audio content modulation or bandwidth changes due to program content. The other use cases can be grouped together as inter (between) station effects.

In case of Use case 5, the present state of art protects only the transition from analog to digital HD IBOC and vice versa by different methods. This includes slowly increasing the bandwidth from analog to digital. The current state of art however does not address the temporal long term effect to the driver. Field test experience has shown that the AM to AM HD transition can have a dramatic increase in volume level which causes a typical end user to manually increase or decrease the volume level depending on the transition.

From the end user experience, the end user typically chooses to manually change the volume levels to a level that is more pleasing to the ear for listener comfort. Hereinbelow is an explanation of the science behind the issues noted from the end user perspective:

1) Explanation of the meaning of bandwidth and its effect on perceived volume and explanation of the scientific basis behind this.
2) Explanation of the use case of how mode balance within a source, such as FM, is not supported by current radio head units in the market space.

Bandwidth and Perceived Volume

Audio files with the same amplitude level and same volume settings but with differing bandwidth levels may have differing levels of perceived loudness or perceived volume. The perceived loudness difference is attributed to the human auditory system which acts as a dedicated band pass filter for all frequencies that can be detected by the human ear. Within each critical band, perceptual loudness is dominated by the frequencies with the strongest intensities. The underlying principle is that when energy within a band is fixed, the loudness remains constant. However, once the bandwidth is exceeded, meaning that the energy is spread over more than one critical hand, there is an increase in perceived loudness.

Although two audio signals may have the sample amplitude levels, the signal with the higher sampling rate may sound perceivably louder than the one with the lower sampling rate. The scientific basis behind this is described hereinbelow. The number of equivalent rectangular bandwidth (ERB) auditory/critical filters as a function of frequency F is given by:

$$P(F) = 21.4 \log_{10}(4.37F + 1) \qquad (1)$$

Accordingly, if there is a 15 kHz sampling rate, setting F to 7.5 kHz results in thirty-two auditory filters. The total loudness metric as applied to demodulated FM audio for a particular volume step is defined as:

$$L = \int_0^P L(p)dp, \text{ where } p = 32 \text{ for FM.} \qquad (2)$$

The metric defined in (2) may be equivalent to the physiological response of the total neural activity evoked. The above principles may be important in determining the volume levels produced by a radio head unit as perceived by a human. Hereinbelow, these principles are applied to real life use examples daunting the radio head unit end user.

The current FM station user experience is an example of how achieving mode balance within a source is a difficult value proposition at present. Stations may operate at modulation levels up to 75 kHz for the North America market where stations are spaced out at 200 kHz steps and typically have bandwidths of 22.5 to 40 kHz. In Europe and Rest Of World, stations are spaced out at 100 kHz steps.

Taking North America as an example, for a fixed volume setting, stations which broadcast talk shows at modulation frequencies around 88.1 MHz sound 'soft' when they are tuned to, while other stations which broadcast talk shows around 95.5 MHz or 90.1 MHz sound 'louder'. That is, the reason for differing loudness levels is the fact that stations operate at different modulation levels.

FM modulation, the levels of which are related to broadcast bandwidth, is a form of angle modulation in which the base-band signal modulates the frequency of a carrier wave. In FM modulation theory, the instantaneous frequency of an FM modulation station is depicted by the following formula:

$$F_i(t) = F_{c*}(t) + K_{VCO} * m(t) \qquad (3)$$

where $F_i(t)$ is the instantaneous FM frequency deviation, $F_c$ is the carrier frequency, $K_{VCO}$ is the voltage to frequency gain of the Voltage Controlled Oscillator (VCO) with units of Hz/V and m(t) is the message signal.

The instantaneous phase of the output FM signal in turn translates to:

$$\Theta = 2\pi F_c * (t) + 2\pi Kvco \int_0^t m(t)dt \qquad (4)$$

where $\Theta$ is the instantaneous phase of the transmitter signal, $F_c$ is the carrier frequency, $K_{VCO}$ is the voltage to frequency gain of the Voltage Controlled Oscillator (VCO) with units of Hz/V and m(t) is the message signal that is modulated onto the carrier wave. The function m(t) may be either speech or music that is transmitted by the FM radio stations, and the typical bandwidth allowed for these two entities is 15 kHz. The carrier wave frequency ranges from 87.7 to 107.9 MHz for the North American market and 87.5 to 108.0 MHz for the European and Rest Of World market.

As such, the transmitted FM signal is defined as:

$$X_{FM}(t) = A_C \cos\left[2\pi F_c * (t) + 2\pi Kvco \int_0^t m(t)dt\right] \qquad (5)$$

where $F_c$ is the carrier frequency, $K_{VCO}$ is the voltage to frequency gain of the Voltage Controlled. Oscillator (VCO) with units of Hz/V and m(t) is the message signal that is modulated onto the carrier wave and $A_C$ is the amplitude of the FM carrier signal.

As noted by Equation 5, the amplitude of the FM signal is constant regardless of the modulated message signal. If m(t) is set to be $A_m \cos 2\pi F_m(t)$ for example, Equation 5 can be rewritten as:

$$X_{FM}(t) = A_C \cos\left[2\pi F_c * (t) + \frac{Kvco * Am}{Fm}\sin 2\pi F_m(t)\right] \qquad (6)$$

In Equation 6 the value $K_{VCO}*Am$ can be termed into $\Delta f$, thereby translating Equation 6 into the following:

$$X_{FM}(t) = A_C \cos\left[2\pi F_c * (t) + \frac{\Delta f}{Fm}\sin 2\pi F_m(t)\right] \qquad (7)$$

In North America, $\Delta f$ translates to a maximum bound of 75 kHz due to the 200 kHz FM step size, while in Europe and Rest Of the World which utilizes 100 kHz FM frequency step size, $\Delta f$ translates to a maximum hound of slightly over 22.5 kHz. Fm is typically about 15 kHz for FM stations.

This mathematical exercise leads to the point that $\Delta f$ is the peak frequency deviation of the FM signal from the center frequency of the Carrier Wave and is directly proportional to the amplitude of the modulated message signal (Am) and the gain of the VCO ($K_{VCO}$).

From a typical end user standpoint, the end result of different radio station frequencies having differing loudness levels is that the driver ends up manually turning up the volume knob of the radio head unit to hear better (e.g., to make the sound more discernible) for a low modulation station. In contrast, when a user tunes to a station with a higher modulation levels, the user may end up manually turning down the volume level. This is a real life cumbersome problem being faced by end users at the present.

In low end radios in the USA, the operation of seek typically causes an audio mute for the duration of the time period in which the radio seeks through the band to find the next strong station. After the next strong station is found, the station is tuned to and un-muting is performed. In mid-range radio head units used in the Europe and North America markets, the use of dual tuners radios is slowly becoming main stream. The introduction of the second tuner supports scaling for phase diversity and building up of the station list when the second tuner performs background scanning of the FM band without the user being aware of it. As improvements in the technology are made, the seek operation is becoming nearly instantaneous and the issue of trying to resolve the 'increased volume levels' during transition from low modulation to high modulation stations is becoming more important.

The current state of art for HD Radio ensures that the analog to digital transition and digital to analog transition sounds smooth to the user but does not provide constant mode balance to the end user. That is, bandwidths are slowly increased and decreased in a manner to ensure that the end user does not hear the perceived audio difference. But if a temporal time perspective is taken at the end, then the user ends up hearing a difference in volume levels.

With digital radio such as HD (In Band On Channel), if an FM station that is tuned to happens to be an analog station, and a digital station that is being switched to has a strong signal, then typically after five seconds the radio receives digital audio synchronization and shifts to HD reception. Consequently, the perceived audio levels increase as the radio receiver transitions from the tuned analog station to the digital radio. The reason for this is that an analog FM station operates at 15 kHz while an HD FM station operates up to 20 kHz. Likewise, when the primary HD station experiences heavy multipath or starts fading, HD FM Blend occurs whereby the radio receiver end user perceives a difference in audio levels as the signal transitions from digital (up to 20 kHz) to analog (up to 15 kHz).

The table in FIG. 3 shows data relevant to perceived audio levels.

SUMMARY OF THE INVENTION

The present invention may be applied to HD Digital Radio applications to address the above-described problems. The invention may provide a method and system for achieving audio mode balance within and across sources. More particularly, the invention may provide a solution to the problem that changing between different broadcast media for the same simulcast listened-to broadcast audio can bring about a difference in perceived volume levels. The novel method of the invention may adjust volume dynamically and may provide a perceived volume metric and avoid discomfort to the end user. The inventive method may take into account the car cabin environment which has engine noise and road noise, both of which can affect perceived volume levels. A microphone input can be used accordingly.

The present invention may automatically increase or decrease the volume level for the end user by employing novel techniques that address the use cases noted in the table of FIGS. 2A-B. Depending on the medium used, the increase or decrease in volume level can be dealt with by either using bandwidth extension algorithms, or automatically increasing the volume level for the end user through a trigger from the Radio HU software.

Bandwidth extension algorithms are typically better suited for digital audio sources like DAB, HD IBOC and other multimedia digital audio sources. Bandwidth extension algorithms may not work well for analog signals which are prone to noise levels triggered by multipath, adjacent channel or frequency offset errors which can cause an increase in noise levels. Bandwidth extension may apply only when the quality of the analog signal is deemed to be good for the long term. The bandwidth extension comes into play in such a manner so as to normalize all digital audio sources to the same bandwidth using techniques like spectral band replication, etc.

In bandwidth normalization, if the user is listening to a low bandwidth station and all neighboring stations are higher bandwidth, bandwidth extension may be applied to the station using information from the neighboring stations' audio bandwidth. Considering use cases 7 and 8 from the table of FIGS. 2A-B, the bandwidth normalization may be possible only if the radio head unit can gauge the currently tuned station's audio bandwidth as compared to the bandwidth of the neighboring stations that are potential targets that the end user can switch to.

FIG. 4 illustrates the audio channel path of the present invention, which can reservable typical flow within a System On Chip (SOC) or ASIC so background audio decode may be employed by multituners and/or a single tuner with wideband ADC and background audio decode capability. For the main audio entertainment path, bandwidth extension applies to digital audio. However, volume detection applies to analog audio. For the second audio path of the background tuner, volume detection also applies.

The volume level for the end user may be automatically increased through a trigger from the radio head unit software which may use the volume loudness level as a metric. This may be better suited for pure analog stations with different modulation levels. The volume increment or decrement steps factor in the Munson Curve to ensure volume gains are applied in such a manner to protect the psychoacoustic model. The Munson is in essence an inversion of the psychoacoustic model such that it provides additional gain to frequencies which the ear is inherently hard of hearing. A calibratable table can be used to translate difference in perceived volume levels to actual volume level step increase or decrease so as to maintain a same mode balance across analog stations.

FIG. 9 is an Equal Loudness Curve which highlights the intensity levels of frequency components required for the human ear to perceive it as equal volume for a particular volume step. The munson curve compensation provided by DSP works under the premise that the input signal contains the full spectrum. If, however, the broadcast station curtails the high bandwidth, then even if the radio receiver supports the munson compensation, then there may be no optimum perceived impact.

In one embodiment, the invention comprises a radio including a first tuner and a second tuner. A processor compares a first perceivable volume level of a station tuned by the first tuner to at least one second perceivable volume level of at least one background station tuned by the second tuner. The processor enables automatic volume knob changes using a pre-calibrated lookup table that associates a volume step of the volume knob with a difference between the first perceivable volume level and the second perceivable volume level.

In another embodiment, the invention comprises a radio including a first tuner and a second tuner. A processor compares a first perceivable volume level of a station tuned by the first tuner to at least one second perceivable volume level of at least one background station tuned by the second tuner. A volume change is performed dependent upon a difference between the first perceivable volume level and the second perceivable volume level.

In yet another embodiment, the invention includes a radio including a first tuner and a second tuner. A processor compares a first perceivable volume level of a station tuned by the first tuner to at least one second perceivable volume level of at least one background station tuned by the second tuner. The processor enables automatic volume knob changes dependent upon a volume step of the volume knob and a difference between the first perceivable volume level and the second perceivable volume level.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 2A is a first portion of a table illustrating processes of the prior art.

FIG. 2B is a second portion of the table of FIG. 2A.

FIG. 2C is a third portion of the table of FIG. 2A.

FIG. 3 is a table illustrating service and related signal quality metrics of the prior art.

FIG. 5A is a first portion of a table illustrating some cases to which the present invention may be applied.

FIG. 5B is a second portion of the table of FIG. 5A.

FIG. 7 is a table mapping out the appropriate volume level settings that may be applied to ensure that an end user perceives a specified volume level in a digital use case.

FIG. 8 is a table mapping out the appropriate volume level settings that may be applied to ensure that an end user perceives a specified volume level in an analog use case.

DETAILED DESCRIPTION

Figure 1:
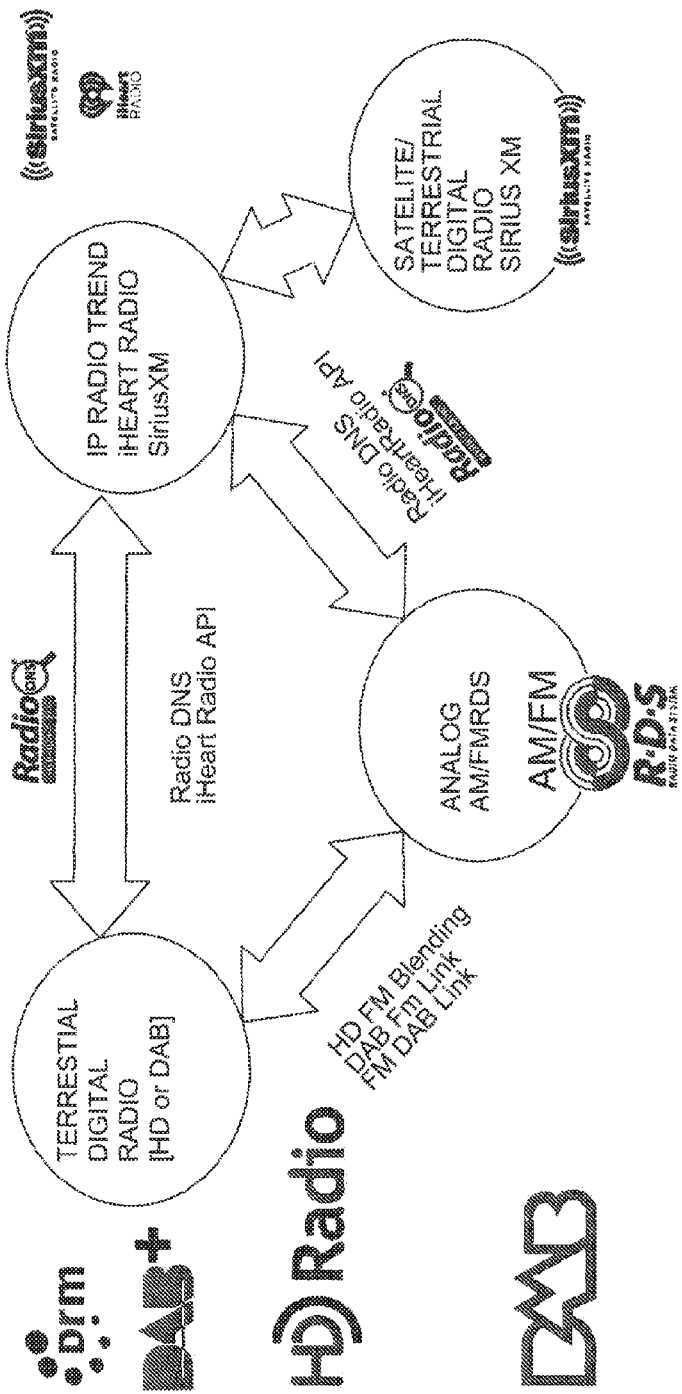
FIG. 1 is a flow chart illustrating known technologies.
Figure 4:
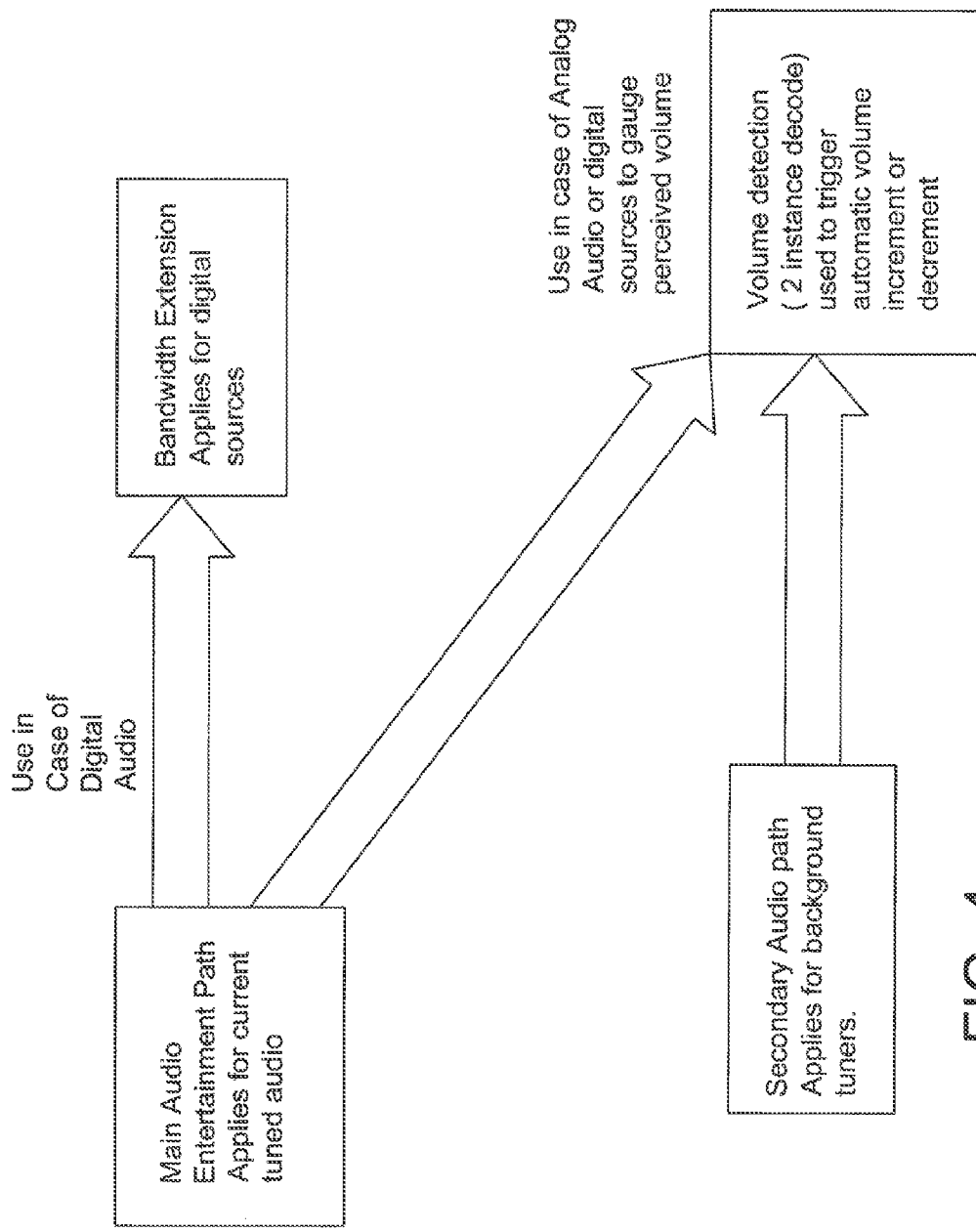
FIG. 4 illustrates an Audio Channel Path of the present invention.

The embodiments hereinafter disclosed are not intended to be exhaustive or limit the invention to the precise forms disclosed in the following description. Rather the embodiments are chosen and described so that others skilled in the art may utilize its teachings.

The main audio entertainment path may apply for the currently tuned audio source. The audio therein may be routed to a core which can run the volume detection algorithm. The second audio path which can apply for audio may be decoded/demodulated by background tuners and or wideband front end devices for other than the currently tuned station audio, and may be routed to volume detection to gauge the volume levels of the currently tuned audio as compared to the background neighboring station audio. This may apply to inter station transition mode balance.

The background audio path can be that of analog and/or digital demodulated audio or bandwidth increase to the main audio source if it is digital to ensure that normalization is achieved in anticipation that the user will traverse or skip to it. This volume level metric along with the a priori information based on digital synchronization cues enables tagging of the station as analog and digital, and may be used to decide whether the volume step increment should be triggered automatically if the current station is analog or if the currently tuned audio is a digital source to employ bandwidth extension algorithms for any existing currently tuned audio source. This a priori information for this decision can be realized by the radio head unit.

In North America, with HD IBOC there is the special situation where an analog station on center frequency can have a digital equivalent (Main Program Station). As such, in test drives in the field there may be transitions from analog to digital and from digital to analog. For example, if there is a transition from analog to digital in the case of HD IBOC radio, the radio head unit may be able to send the HD synchronization cue for it to know it is a transition from analog to digital and vice versa. This information may be needed in case a user skips from the current station to another station.

The above-disclosed process may be possible due to four reasons. First, Silicon On Chip (SOC) with multi-core processors supporting additional processing power are providing enabling technology to signal processing algorithms that previously was not possible to implement.

Second, software radio ASICS and SOC designs have increased processing power to support simultaneous audio demodulation for the currently tuned station and background stations, enabling the present invention.

Third, software radio front ends are becoming multiband and wideband as well. What the latter means is that the front end ADC (Analog to Digital) converter can sample the entire frequency band and, depending on the processing capability of the multicore processors, background stations with potential for simultaneous audio demodulation for select stations may be sampled. This technology can especially change the capabilities of single tuner radios without the need for background tuners for background scanning functionality.

Fourth, connectivity may also enable the option for onboard partitioning instead of offboard partitioning for processing power needs. Thus, the radio head unit can include a single tuner and have the algorithm to gauge the current audio source. The back end can perform processing for what used to be dedicated second or third tuner processing on the radio head unit side through an off board server keeping track of the GPS location and the potential "local" frequency landscape that the car is located in. The back end may also decode the audio for other stations in the vicinity using an off board server to gauge the volume metric.

The invention provides a practical solution to address the use cases defined in the table of FIGS. 5A-B. The invention may be applied to dual and multi tuner environments as well as to single tuner radios.

Use Case with Dedicated on Board Dual and/or Multi Tuner on the Radio Head Unit

Dual or Multi Tuners enable the radio to be tuned to a particular station while the background tuners scan the other frequencies in the band. In the past, the second tuner enabled the background tuner only to do background scanning of station frequencies and did not provide audio decode capability due to a shortage in processing power of either the SOC (System On Chip) or the ASIC (Application Specific IC). The current state of the art, however, includes the capability to do audio demodulation on both the main tuner and background tuners.

With the second tuner performing audio demodulation, it is possible to compare the perceived volume level of the currently tuned station to that of background stations and enable automatic volume knob changes using a pre-calibrated lookup table that associates the volume step with the difference between the perceived volume levels of the currently tuned station and the background stations. This automatic volume change can be either an increase or decrease in volume levels depending on the end user's original volume level setting. This automatic volume change can be performed for analog stations. If stations are digital, the a priori information can be used to ensure bandwidth normalization of the current tuned station using the bandwidth of neighboring stations.

As an example, sampled audio of the analog demodulated audio from background tuners may be decomposed into N number of subbands using PQMF (Psuedo Quadrature Mirror Filters). The value N depends on the band being used. In the case of analog FM where the bandwidth is capped at 15 kHz, N is 32.

In the case of FM, this can be computed using:

$$P(F) = 21.4 \log_{10}(4.37F + 1) \qquad (8)$$

Accordingly, if there is a 15 kHz sampling rate, setting F as 7.5 kHz results in thirty-two auditory filters. For example, using the table of FIGS. 2A-B as gauge, for AM HD where the total bandwidth can be 15 kHz there may be thirty-two subbands.

In all situations, the common metric of the formula below may be used. The total loudness metric as applied to demodulated FM audio for a particular volume step may thus be defined as:

$$L = \int_0^P L(p)dp, \text{ where } p = 32 \text{ for FM}. \qquad (9)$$

Figure 6:
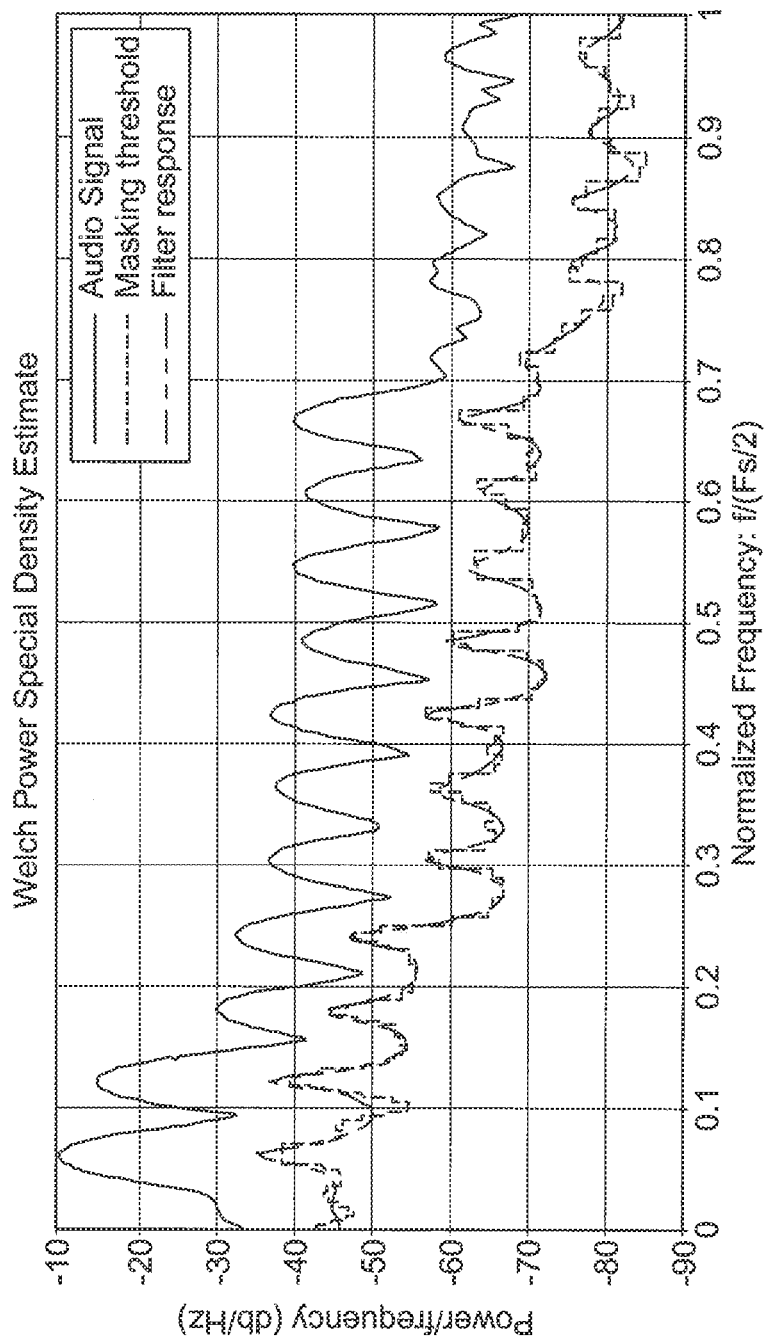
FIG. 6 shows a 512-sample audio signal frame normalized spectrum plot.
Figure 9:
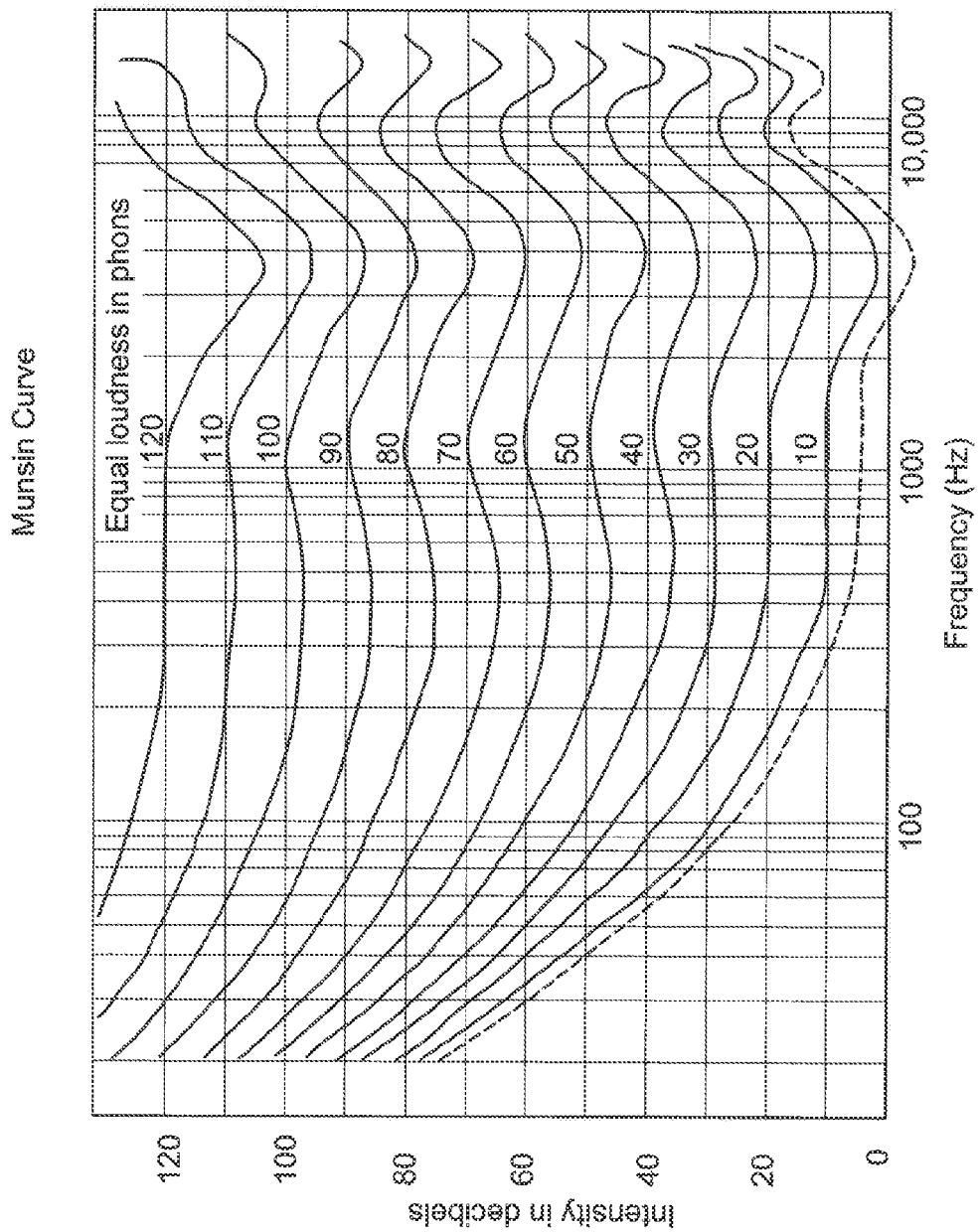
FIG. 9 is a Munson curve.

FIG. 6 shows a 512 sample audio signal frame normalized spectrum plot. FIG. 6 is a Welch power spectral density estimate as a plot of power/frequency (dB/Hz) vs. normalized frequency: f/(Fs/2). The darkest line represents the filtered response of the masking threshold level. The dashed line represents the masking threshold. The darkest line can in turn be calibrated to take into account the car cabin environment noise through a microphone input. The lighter solid line represents that signal for this particular 512 sample frame, which is audible to the end user and is above the darkest line.

The present invention may make use of the (ISO/CEI norm 11172-3:1993 F) MPEG1 psychoacoustic model in Matlab. MPEG 1 may use a 512 sample frame from an input signal, and may use the psychoacoustic model to compute a global masking threshold by computing the individual tonal and noise masking frequencies utilizing the pre- and post-masking nature for temporal effects and combining them into a final auditory masking threshold for that frame per subband. The algorithm may be applied to each of the thirty-two sub bands and may return twenty-seven signal-to-mask ratios (SMR) in dB scale, and SMR 28 to 32 are not used. For every 512 sample frame, demodulated audio levels which have signal energy above the masking threshold may be computed for that specific subband, and an average energy may be computed temporally across time for the duration that the background tuner is harboring on the station. The same may be done for the main tuned station.

Since the broadcast audio is continuously changing depending on the song that the artist is playing, the background tuner may sample stations at regular intervals and compute the appropriate energy levels above the psychoacoustic masking level, which is what is audible by the human ear for perceived volume, and may thus define a perceived volume level. For example, a total loudness metric as applied to demodulated FM analog audio for a particular volume step may be thus defined as:

$$L = \int_0^P L(p)dp, \text{ where } p = 32 \text{ for FM for example}. \qquad (10)$$

This value may be stored in RAM memory area in a table (FIG. 7) which may be created to map out the appropriate volume level settings that need to be applied to ensure that the end user perceives a specified volume level. The trust timer may be used to ensure that if a station has been sampled, then the background tuners can scan other frequencies in the neighboring area for the duration of the countdown of the trust timer.

The perceived volume level comparison may take into account the following three factors. The first factor is signal energy levels above audio masking levels. To ensure that the algorithm scales for scenarios in the car cabin environment, microphone input to the car radio head unit can be used to ensure sampling of the background noise (e.g., engine noise and road noise) and factoring in of the masking threshold level shifts.

The second factor is the averaged audio bandwidth of the currently tuned station vs. that of secondary neighboring stations. This can be determined by doing a Fast Fourier Transform of the demodulated audio for digital and analog audio or by utilizing the modulation level of demodulated audio for analog audio.

The third factor is quality metrics such as fieldstrength, multipath, adjacent energy and frequency offset in the case of analog FM; fieldstrength, adjacent energy and frequency offset in the case of AM; and BER in the case of DAB signals to ensure that the algorithm does not engage when dealing with weak stations having noise which should not be amplified.

Use Case with Analog AM/FM Single Tuner without Wideband Scanning Support

As mentioned above, the present invention may be applied to analog AM/FM single tuner radios as well as to dual and multi tuner radios. FIG. 8 is a table similar to the table of FIG. 7, but applicable to analog signals. If the radio is tuned to a low modulation station on a single tuner radio, then on each audio pause the front end DSP may perform a quick alternate frequency check on two neighbor frequencies of the low modulation station. The alternative frequency checks occur within seven millisecond intervals and cannot be perceived by the user as the frequency checks are triggered when the present audio tuned station gets a pause. Each frequency quality check may yield the fieldstrength and modulation levels. The fieldstrength (dBuV) may be needed as the modulation level check is only valid for strong quality station frequencies which are characterized by a strong fieldstrength level.

The radio receiver can calculate the average modulation level of the neighboring frequencies and compare it against the modulation level of the currently tuned station frequency. The radio receiver can then determine whether the user will perceive a volume difference in the event that the user does a tune or seek to the neighboring frequency station. In such a circumstance, the present invention provides a mechanism whereby after the tune or seek settles on the higher modulation level, the radio receiver automatically adjusts the volume level without user intervention.

On Multimedia Sources

DAB and HD IBOC digital audio sources are in essence similar to multimedia audio files. In the case of a multimedia source, the same issue arises when a user traverses from different compression rate audio files. Herein a background instance compressed audio decoder can be used to gauge the volume and ensure mode balance for the current multimedia source.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A radio, comprising:
a first tuner and a second tuner; and
a processor configured to:

compare a first volume level of a station tuned by the first tuner to at least one second volume level of at least one background station tuned by the second tuner; and enable automatic volume knob changes using a pre-calibrated lookup table that associates a volume step of the volume knob with a difference between the first volume level and the second volume level.

2. The radio of claim 1, wherein the automatic volume knob changes comprise volume increases or volume decreases depending upon an existing volume level of the radio.

3. The radio of claim 1, wherein the station tuned by the first tuner is an analog station.

4. The radio of claim 1, wherein the background station is an analog station.

5. The radio of claim 1, comprising temporally computing an average energy of the station tuned by the first tuner, the first volume level of the station tuned by the first tuner being determined dependent upon the temporally computed average energy.

6. The radio of claim 1, comprising temporally computing an average energy of the background station, the second volume level of the background station being determined dependent upon the temporally computed average energy.

7. The radio of claim 1, wherein the processor is configured to implement the automatic volume knob changes in association with switching from audibly playing the station tuned by the first tuner to audibly playing the background station.

8. A radio, comprising:
a first tuner and a second tuner; and
a processor configured to:
compare a first volume level of a station tuned by the first tuner to at least one second volume level of at least one background station tuned by the second tuner;
perform a volume change dependent upon a difference between the first volume level and the second volume level; and
temporally compute an average energy of the station tuned by the first tuner, the first volume level of the station tuned by the first tuner being determined dependent upon the temporally computed average energy.

9. The radio of claim 8, wherein the processor is configured to enable automatic volume knob changes using a pre-calibrated lookup table that associates a volume step of the volume knob with a difference between the first volume level and the second volume level.

10. The radio of claim 8, wherein the station tuned by the first tuner is an analog station.

11. The radio of claim 8, wherein the background station is an analog station.

12. The radio of claim 8, wherein the first volume level comprises a first perceivable volume level.

13. The radio of claim 8, wherein the processor is configured to temporally compute an average energy of the background station, the second volume level of the background station being determined dependent upon the temporally computed average energy.

14. The radio of claim 8, wherein the second volume level comprises a second perceivable volume level.

15. A radio, comprising:
a first tuner and a second tuner; and
a processor configured to:
compare a first volume level of a station tuned by the first tuner to at least one second volume level of at least one background station tuned by the second tuner;
enable automatic volume knob changes dependent upon a volume step of the volume knob and a difference between the first volume level and the second volume level; and
temporally compute an average energy of the station tuned by the first tuner, the first volume level of the station tuned by the first tuner being determined dependent upon the temporally computed average energy.

16. The radio of claim 15, wherein the automatic volume knob changes comprise volume increases or volume decreases depending upon an existing volume level of the radio.

17. The radio of claim 15, wherein the station tuned by the first tuner and/or the background station is an analog station.

18. The radio of claim 15, wherein the processor is configured to temporally compute an average energy of the background station, the second volume level of the background station being determined dependent upon the temporally computed average energy.

19. The radio of claim 15, wherein at least one of the first volume level and the second volume level is perceivable.

20. The radio of claim 15, wherein the processor is configured to implement the automatic volume knob changes in association with switching from audibly playing the station tuned by the first tuner to audibly playing the background station.

* * * * *